(12) United States Patent
Han et al.

(10) Patent No.: US 11,948,861 B2
(45) Date of Patent: Apr. 2, 2024

(54) LIQUID COOLING MODULE AND METHOD OF FORMING THE SAME

(71) Applicant: Agency for Science, Technology and Research, Singapore (SG)

(72) Inventors: Yong Han, Singapore (SG); Boon Long Lau, Singapore (SG); Gongyue Tang, Singapore (SG); Xiaowu Zhang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 521 days.

(21) Appl. No.: 17/274,520

(22) PCT Filed: Aug. 19, 2019

(86) PCT No.: PCT/SG2019/050408
§ 371 (c)(1),
(2) Date: Mar. 9, 2021

(87) PCT Pub. No.: WO2020/060482
PCT Pub. Date: Mar. 26, 2020

(65) Prior Publication Data
US 2022/0051967 A1 Feb. 17, 2022

(30) Foreign Application Priority Data
Sep. 17, 2018 (SG) .......................... 10201808040R

(51) Int. Cl.
*H01L 23/473* (2006.01)
*H01L 21/48* (2006.01)

(52) U.S. Cl.
CPC ...... *H01L 23/4735* (2013.01); *H01L 21/4871* (2013.01)

(58) Field of Classification Search
CPC ............ H01L 23/3736; H01L 23/3738; H01L 23/3672; H01L 23/34; H01L 23/473; H01L 23/4735; H01L 21/4871
See application file for complete search history.

(56) References Cited

U.S. PATENT DOCUMENTS

| 4,069,498 | A |   | 1/1978 | Joshi |
| 5,316,077 | A | * | 5/1994 | Reichard .................. F28F 3/12 |
|   |   |   |   | 257/E23.098 |

(Continued)

FOREIGN PATENT DOCUMENTS

CN 202816913 U 3/2013

OTHER PUBLICATIONS

Han et al., "Si-Based Hybrid Microcooler With Multiple Drainage Microtrenches for High Heat Flux Cooling," IEEE Transactions on Components, Packaging and Manufacturing Technology, vol. 7, No. 1, Jan. 2017, pp. 50-57.

(Continued)

*Primary Examiner* — Nelson J Nieves
(74) *Attorney, Agent, or Firm* — Shackelford, Bowen, McKinley & Norton, LLP

(57) ABSTRACT

Various embodiments may relate to a liquid cooling module. The liquid cooling module may include a main body. The main body may include a cooling core including a micro-fluidic structure configured to carry a cooling liquid. The main body may also include a plurality of slots. The liquid cooling module may further include a sealing pad configured to transmit heat from an electronic device to the cooling core. The liquid cooling module may additionally include a plurality of fins extending from the main body, each of the plurality of fins including an internal circulating liquid duct such that the liquid cooling module includes a plurality of (Continued)

internal circulating liquid ducts in fluidic communication with the microfluidic structure.

19 Claims, 15 Drawing Sheets

(56) References Cited

U.S. PATENT DOCUMENTS

| | | | | |
|---|---|---|---|---|
| 6,019,165 A * | 2/2000 | Batchelder | ............ | H01L 23/467 |
| | | | | 165/80.4 |
| 6,263,957 B1 * | 7/2001 | Chen | ..................... | H01L 23/473 |
| | | | | 174/15.1 |
| 6,377,458 B1 * | 4/2002 | Morris | ............... | H01L 23/4735 |
| | | | | 174/15.1 |
| 6,606,251 B1 * | 8/2003 | Kenny, Jr. | ................. | G06F 1/26 |
| | | | | 361/764 |
| 6,785,134 B2 * | 8/2004 | Maveety | ............... | H01L 23/473 |
| | | | | 361/689 |
| 6,889,756 B1 | 5/2005 | Hou | | |
| 6,903,929 B2 | 6/2005 | Prasher et al. | | |
| 7,139,172 B2 | 11/2006 | Bezama et al. | | |
| 7,156,159 B2 | 1/2007 | Lovette et al. | | |
| 7,450,378 B2 * | 11/2008 | Nelson | ................ | H01L 23/4735 |
| | | | | 361/689 |
| 7,597,135 B2 | 10/2009 | Ghosh et al. | | |
| 7,701,714 B2 | 4/2010 | Shabany | | |
| 7,738,250 B2 * | 6/2010 | Wu | ....................... | H01L 23/473 |
| | | | | 165/80.4 |
| 8,077,460 B1 * | 12/2011 | Dede | ...................... | F28F 9/026 |
| | | | | 174/15.1 |
| 8,199,505 B2 * | 6/2012 | Dede | .................. | H01L 23/4735 |
| | | | | 165/185 |
| 8,388,142 B2 * | 3/2013 | Jones | ....................... | F28F 3/14 |
| | | | | 165/104.11 |
| 8,391,008 B2 * | 3/2013 | Dede | .................. | H05K 7/20927 |
| | | | | 361/689 |
| 8,427,832 B2 * | 4/2013 | Dede | ..................... | F28F 9/0221 |
| | | | | 361/717 |
| 8,482,919 B2 * | 7/2013 | Dede | ..................... | H01L 23/473 |
| | | | | 165/80.4 |
| 8,659,896 B2 * | 2/2014 | Dede | .................. | H05K 7/20927 |
| | | | | 165/80.4 |
| 8,786,078 B1 * | 7/2014 | Rau | ...................... | H05K 7/2029 |
| | | | | 257/776 |
| 8,910,706 B2 * | 12/2014 | Gilliland | ................... | F28F 1/08 |
| | | | | 165/104.31 |
| 8,981,556 B2 | 3/2015 | Joshi | | |
| 9,131,631 B2 * | 9/2015 | Joshi | ................... | H01L 23/4735 |
| 9,443,786 B1 * | 9/2016 | Rippel | ................. | H01L 25/115 |
| 10,952,352 B2 * | 3/2021 | Qu | ........................... | F28F 3/02 |
| 2003/0062149 A1 | 4/2003 | Goodson et al. | | |
| 2004/0182551 A1 * | 9/2004 | Zhou | ................... | H01L 23/473 |
| | | | | 257/E23.098 |
| 2004/0188065 A1 * | 9/2004 | Shook | ................... | F28F 19/006 |
| | | | | 165/80.4 |
| 2006/0011326 A1 | 1/2006 | Yuval | | |
| 2006/0133039 A1 | 6/2006 | Belady | | |
| 2006/0196642 A1 | 9/2006 | Gharib et al. | | |
| 2007/0121299 A1 | 5/2007 | Campbell et al. | | |
| 2009/0283244 A1 | 11/2009 | Bezama et al. | | |

OTHER PUBLICATIONS

Mitra et al., "Microfluidics and Nanofluidics Handbook: Fabrication, Implementation, and Applications," 2012, Section 9.3, one page.
International Search Report for International Application No. PCT/SG2019/050408 dated Nov. 5, 2019, pp. 1-3.
Written Opinion of the International Searching Authority for International Application No. PCT/SG2019/050408 dated Nov. 5, 2019, pp. 1-4.

* cited by examiner

⊙ cooling liquid flowing out

⊗ cooling liquid flowing in

⊙ cooling liquid flowing out

⊗ cooling liquid flowing in

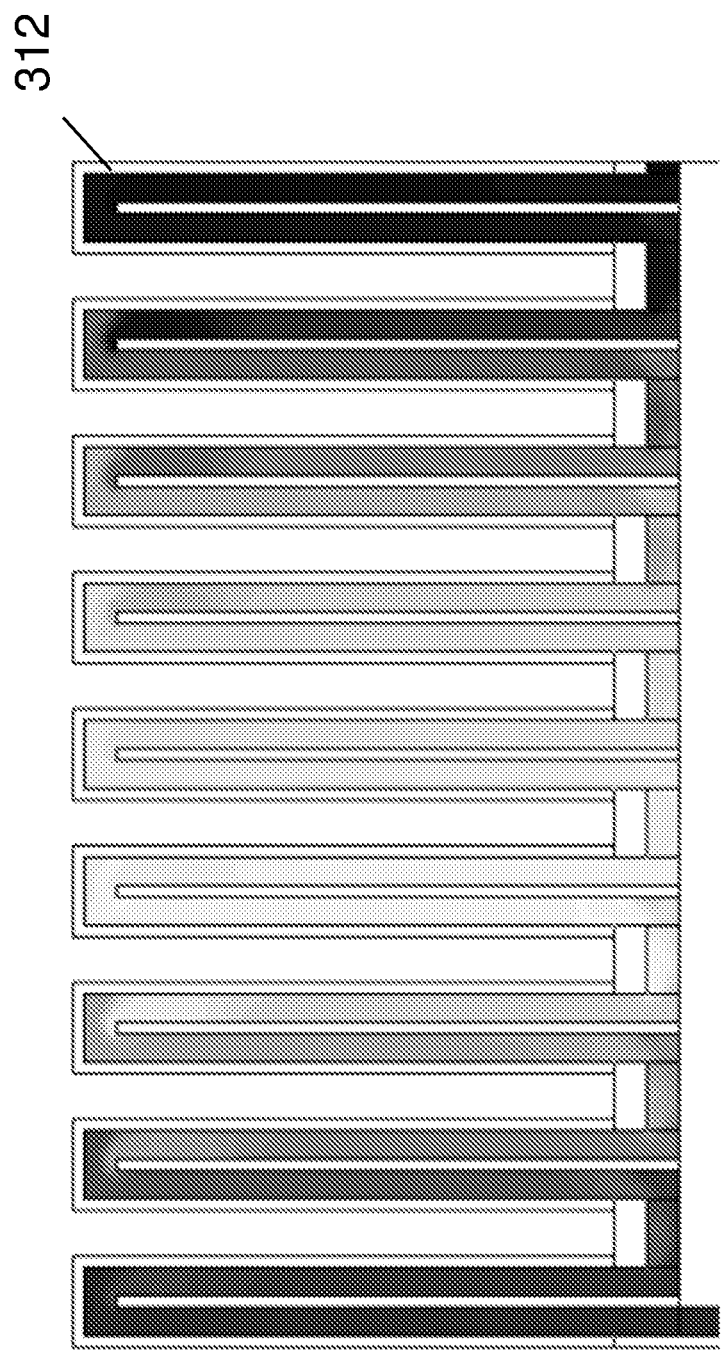

LIQUID COOLING MODULE AND METHOD OF FORMING THE SAME

CROSS-REFERENCE TO RELATED APPLICATION

This application claims the benefit of priority of Singapore application No. 10201808040R filed on Sep. 17, 2018, the contents of it being hereby incorporated by reference in its entirety for all purposes.

TECHNICAL FIELD

Various aspects of this disclosure relate to a liquid cooling module. Various aspects of this disclosure may relate to a method of forming a liquid cooling module.

BACKGROUND

The development of the modern electronic devices, including shrinking feature sizes, incorporation of more functions, and increasing circuit speeds, is leading to significant increases in the packing densities and heat fluxes. Temperature rise caused by increasing power consumption and more compact sizes becomes quite a significant challenge for modern electronic devices. Effective thermal management may be the key to ensure efficiency and reliability of the devices.

As air cooling reaches limits of heat dissipation, liquid cooling is being applied to electronic systems. Liquid cooling solutions, especially microfluidic technologies, which enable high heat transfer rate, have attracted worldwide research interest. However, due to the increasing power densities of high-performance chips and high-power devices, the design of effective cooling strategies is becoming more difficult. Furthermore, complex exterior auxiliary parts in liquid cooling systems may not be fitted into compact devices to replace air heat sinks for effective cooling.

SUMMARY

Various embodiments may relate to a liquid cooling module. The liquid cooling module may include a main body. The main body may include a cooling core including a microfluidic structure configured to carry a cooling liquid. The main body may also include a plurality of slots. The liquid cooling module may further include a sealing pad configured to transmit heat from an electronic device to the cooling core. The liquid cooling module may additionally include a plurality of fins extending from the main body, each of the plurality of fins including an internal circulating liquid duct such that the liquid cooling module includes a plurality of internal circulating liquid ducts in fluidic communication with the microfluidic structure. A first fin of the plurality of fins may include a first internal circulating liquid duct including a first portion connected to a first slot of the plurality of slots and configured to lead the cooling liquid away from the cooling core, a second portion connected to a second slot of the plurality of slots and configured to lead the cooling liquid towards the cooling core, and an intervening portion connecting the first portion and the second portion. A second fin of the plurality of fins may include a second internal circulating liquid duct configured to receive the cooling liquid from the first internal circulating liquid duct via the second slot of the plurality of slots, the second internal circulating liquid duct including a first portion connected to the second slot of the plurality of slots and configured to lead the cooling liquid away from the cooling core, a second portion connected to a third slot of the plurality of slots and configured to lead the cooling liquid towards the cooling core, and an intervening portion connecting the first portion and the second portion.

Various embodiments may relate to a method of forming a liquid cooling module. The method may include forming a main body. The main body may include a cooling core including a microfluidic structure configured to carry a cooling liquid, and a plurality of slots. The method may also include forming a sealing pad configured to transmit heat from an electronic device to the cooling core. The method may additionally include forming a plurality of fins extending from the main body, each of the plurality of fins including an internal circulating liquid duct such that the liquid cooling module includes a plurality of internal circulating liquid ducts in fluidic communication with the microfluidic structure. A first fin of the plurality of fins may include a first internal circulating liquid duct. The first internal circulating liquid duct may include a first portion connected to a first slot of the plurality of slots and configured to lead the cooling liquid away from the cooling core, a second portion connected to a second slot of the plurality of slots and configured to lead the cooling liquid towards the cooling core, and an intervening portion connecting the first portion and the second portion. A second fin of the plurality of fins may include a second internal circulating liquid duct. The second internal circulating liquid duct may be configured to receive the cooling liquid from the first internal circulating liquid duct via the second slot of the plurality of slots. The second internal circulating liquid duct may include a first portion connected to the second slot of the plurality of slots and configured to lead the cooling liquid away from the cooling core, a second portion connected to a third slot of the plurality of slots and configured to lead the cooling liquid towards the cooling core, and an intervening portion connecting the first portion and the second portion.

BRIEF DESCRIPTION OF THE DRAWINGS

The invention will be better understood with reference to the detailed description when considered in conjunction with the non-limiting examples and the accompanying drawings, in which:

FIG. 4A is a simulation diagram showing the pressure distribution in fins of the module according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or liquid cooling modules are analogously valid for the other methods or liquid cooling modules. Similarly, embodiments described in the context of a method are analogously valid for a liquid cooling module, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
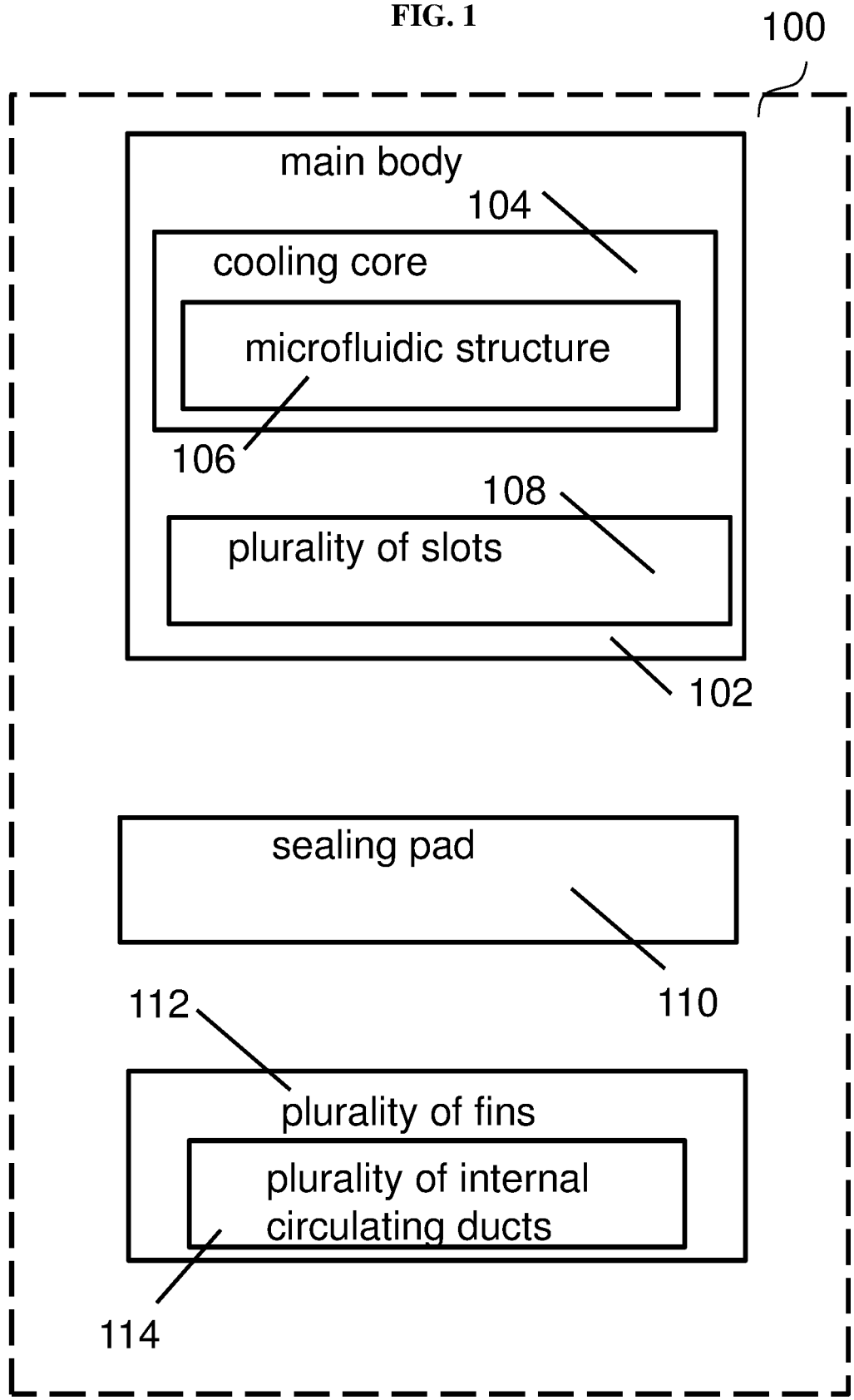
FIG. 1 is a general illustration of a liquid cooling module according to various embodiments.

FIG. 1 is a general illustration of a liquid cooling module 100 according to various embodiments. The liquid cooling module 100 may include a main body 102. The main body 102 may include a cooling core 104 including a microfluidic structure 106 configured to carry a cooling liquid. The main body 102 may also include a plurality of slots 108. The liquid cooling module 100 may further include a sealing pad 110 configured to transmit heat from an electronic device to the cooling core 104. The liquid cooling module 100 may additionally include a plurality of fins 112 extending from the main body 102, each of the plurality of fins 112 including an internal circulating liquid duct such that the liquid cooling module 100 includes a plurality of internal circulating liquid ducts 114 in fluidic communication with the microfluidic structure 106.

A first fin of the plurality of fins 112 may include a first internal circulating liquid duct (of the plurality of internal circulating ducts 114) including a first portion connected to a first slot of the plurality of slots 108 and configured to lead the cooling liquid away from the cooling core 104, a second portion connected to a second slot of the plurality of slots 108 and configured to lead the cooling liquid towards the cooling core 104, and an intervening portion connecting the first portion (of the first internal circulating liquid duct) and the second portion (of the first internal circulating liquid duct).

A second fin of the plurality of fins 112 may include a second internal circulating liquid duct (of the plurality of internal circulating ducts 114) configured to receive the cooling liquid from the first internal circulating liquid duct via the second slot of the plurality of slots 108, the second internal circulating liquid duct including a first portion connected to the second slot of the plurality of slots 108 and configured to lead the cooling liquid away from the cooling core 104, a second portion connected to a third slot of the plurality of slots 108 and configured to lead the cooling liquid towards the cooling core 104, and an intervening portion connecting the first portion (of the second internal circulating duct) and the second portion (of the second internal circulating duct).

In other words, the liquid cooling module 100 may include a main body 102 with a cooling core 104 having a microfluidic structure 106, and a plurality of slots 108 providing access to the microfluidic structure 106. The module 100 may also include a sealing pad which is configured to transmit heat from an electronic device to the main body 102. The module 100 may further include a plurality of fins 112 with internal circulating ducts 114 coupled to the microfluidic structure 106 via the plurality of slots 108.

For avoidance of doubt, FIG. 1 seeks to highlight the features of a liquid cooling module 100 according to various embodiments, and is not intended to indicate or limit the arrangement, orientation, shapes, and sizes etc. of the various features.

In the current context, "leading the cooling liquid away from the cooling core" may refer to the situation in which a part or portion, e.g. a drop, of the cooling liquid is at a first position at a first predetermined time, and is guided to be at a second position further away (in space) from the cooling core at a second predetermined time later than the first predetermined time. In other words, the part or portion of the cooling liquid is so guided that the displacement between the part or portion of the cooling liquid and the cooling core increases with increasing time.

Conversely, "lead the cooling liquid towards the cooling core" may refer to the situation in which a part or portion, e.g. a drop, of the cooling liquid is at a first position at a first predetermined time, and is guided to be at a second position further nearer (in space) from the cooling core at a second predetermined time later than the first predetermined time. In other words, the part or portion of the cooling liquid is so guided that the displacement between the part or portion of the cooling liquid and the cooling core decreases with increasing time.

In various embodiments, the first portion, the intervening portion, and the second portion of an internal circulating liquid duct (e.g. the first internal circulating liquid duct or the second internal circulating liquid duct) may form an inverted "U" shape (with a straight or curved intervening portion).

In various embodiments, the liquid cooling module 100 may also include a pump configured to pump the cooling liquid so that the cooling liquid flows along the microfluidic structure 106 and the plurality of internal circulating liquid ducts 114. The "cooling liquid" may generally refer to any fluid, solution, or liquid which may be carried from one part of the module 100 to another part of the module 100, thus transferring thermal energy. The cooling liquid may for instance be antifreeze, e.g. a solution of ethylene glycol, diethylene glycol, or propylene glycol.

In various embodiments, the pump may be any one selected from group consisting of a mechanical gear pump, an electroosmotic pump, and a piezoelectric actuator pump.

In various embodiments, the liquid cooling module 100 may additionally include one or more temperature sensors configured to sense temperature parameters of the cooling module 100. The liquid cooling module 100 may further include a control circuit configured to control the pump based on the temperature parameters.

In various embodiments, the one or more temperature sensors may include a conductor temperature sensor configured to sense a temperature parameter of a region between the sealing pad 110 and the microfluidic structure 106. The one or more temperature sensors may include a convection temperature sensor configured to sense a temperature parameter related to the cooling liquid.

In various embodiments, the main body 102 further includes a plurality of backside studs configured to transmit heat from the sealing pad 110 to the cooling core 104. The backside studs may include a thermally conductive material, for instance a metal such as copper.

In various embodiments, the microfluidic structure 106 includes an array including a plurality of micro jet channels configured to cool the cooling liquid via micro jet impingement.

In various embodiments, the microfluidic structure 106 may include an inlet channel configured to direct the cooling liquid to the array. The micro fluidic structure 106 may include an outlet channel configured to direct the cooling liquid away from the array.

Each of the plurality of fins 112 may include a conduction fin extending into the internal circulating liquid duct. For instance, the first fin may have a first conduction fin extending into the first internal circulating liquid duct, and the second fin may have a second conduction fin extending into the second internal circulating liquid duct. In various embodiments, each of the plurality of fins 112 may have more than one conduction fins, e.g. two conduction fins, extending into the internal circulating liquid duct. The conduction fin(s) may extend partially into the internal circulating liquid duct such that the fin(s) does not completely block the passage of the flow of cooling liquid through the duct. The conduction fin(s) may improve the surface area of the internal circulating liquid duct, and may improve on the effectiveness of heat dissipation.

In various embodiments, the plurality of fins 112 may be arranged in a plurality of rows.

In various embodiments, the plurality of fins 112 may be configured such that the liquid coolant flows in parallel paths, each path formed by internal circulating ducts included in a row of fins (of the plurality of rows).

In various other embodiments, the plurality of fins 112 may be configured such that the liquid cooling flows from a first path formed by internal circulating ducts included in a first row of fins (of the plurality of rows) to a second path formed by internal circulating ducts included in a second row of fins (of the plurality of rows).

In various embodiments, the plurality of slots 108 may be aligned in parallel in a staggered manner.

The intervening portion of the first internal circulating liquid duct may extend parallel to a first axis, the first axis perpendicular to a second axis in which each of the first portion and the second portion of the first internal circulating liquid duct extend parallel to. The intervening portion of the second internal circulating liquid duct may extend parallel to the first axis perpendicular to the second axis in which each of the first portion and the second portion of the second internal circulating liquid duct extend parallel to. In other words, the intervening portion of the first internal circulating liquid duct and the intervening portion of the second internal circulating liquid duct may be parallel to the first axis, while the first and second portions of the first internal circulating liquid duct, as well as the first and second portions of the second internal circulating liquid duct may be parallel to the second axis, which may be perpendicular to the first axis.

Each of the first slot, the second slot, and the third slot may extend parallel to a third axis which is perpendicular to the second axis.

In various embodiments, the first internal circulating liquid duct may be configured so that the flow of the cooling liquid along the first internal circulating liquid duct is in a first rotation direction. In various embodiments, the second internal circulating liquid duct may be configured so that the flow of the cooling liquid along the second internal circulating liquid duct is in a second rotation direction opposite the first rotation direction.

In various embodiments, the first rotation direction may be anticlockwise, and the second rotation direction may be clockwise. In various other embodiments, the first rotation direction may be clockwise, and the second rotation direction may be anticlockwise.

Figure 2:
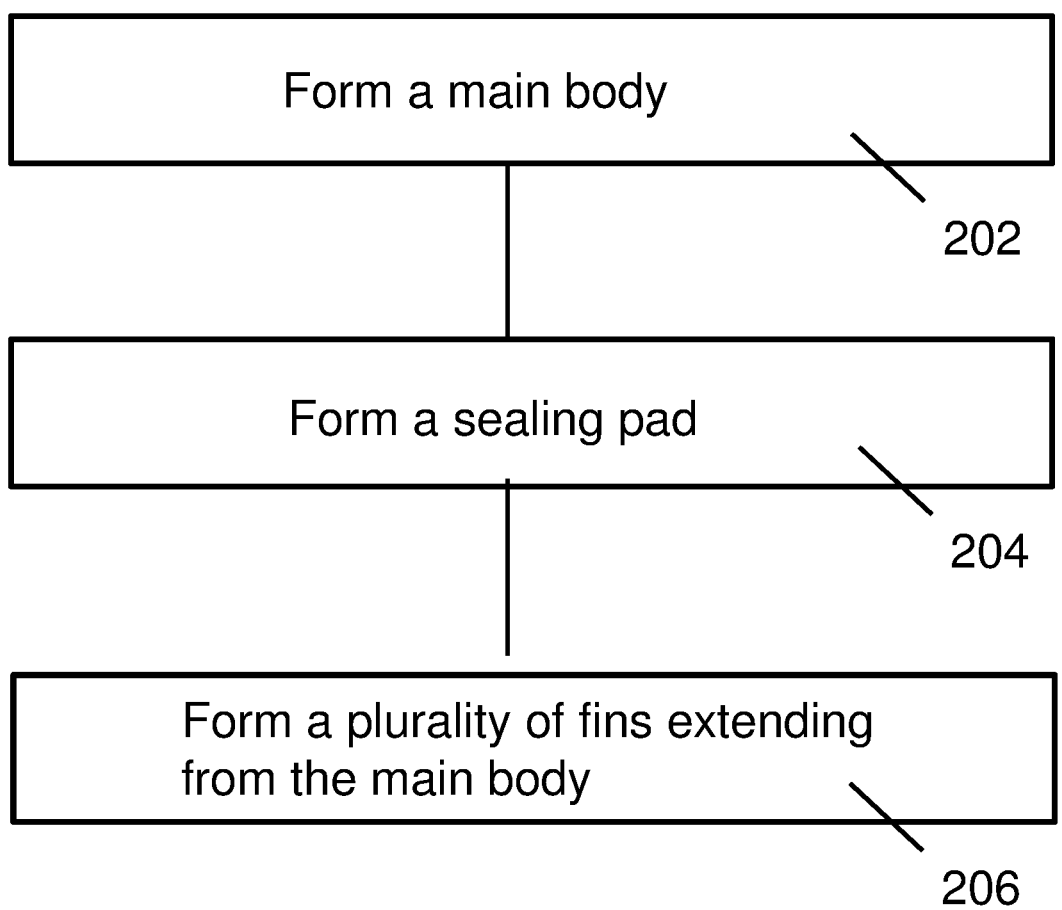
FIG. 2 is a general illustration of a method of forming a liquid cooling module according to various embodiments.

FIG. 2 is a general illustration of a method of forming a liquid cooling module according to various embodiments. The method may include, in 202, forming a main body. The main body may include a cooling core including a microfluidic structure configured to carry a cooling liquid, and a plurality of slots. The method may also include, in 204, forming a sealing pad configured to transmit heat from an electronic device to the cooling core. The method may additionally include, in 206, forming a plurality of fins extending from the main body, each of the plurality of fins including an internal circulating liquid duct such that the liquid cooling module includes a plurality of internal circulating liquid ducts in fluidic communication with the microfluidic structure.

A first fin of the plurality of fins may include a first internal circulating liquid duct. The first internal circulating liquid duct may include a first portion connected to a first slot of the plurality of slots and configured to lead the cooling liquid away from the cooling core, a second portion connected to a second slot of the plurality of slots and configured to lead the cooling liquid towards the cooling core, and an intervening portion connecting the first portion and the second portion. A second fin of the plurality of fins may include a second internal circulating liquid duct. The second internal circulating liquid duct may be configured to receive the cooling liquid from the first internal circulating liquid duct via the second slot of the plurality of slots. The second internal circulating liquid duct may include a first portion connected to the second slot of the plurality of slots and configured to lead the cooling liquid away from the cooling core, a second portion connected to a third slot of the plurality of slots and configured to lead the cooling liquid towards the cooling core, and an intervening portion connecting the first portion and the second portion.

In other words, the method may include forming the main body, forming the sealing pad, and forming the plurality of pins.

For avoidance of doubt, FIG. 2 is not intended to limit the sequence of the steps. For instance, step 202 may occur before, after, or at the same time as step 204.

The method may also include forming a pump configured to pump the cooling liquid so that the cooling liquid flows along the microfluidic structures and the plurality of internal circulating liquid ducts.

The method may include forming one or more temperature sensors configured to sense temperature parameters of the cooling module. The method may also include forming a control circuit configured to control the pump based on the temperature parameters.

Various embodiments may relate to a liquid cooling module of compact size and intact functions for thermal management of electronic devices. Several new structures have been designed: exterior raised liquid fins with internal circulating ducts and fin-in-fin structures; multiple liquid fins directly connected with multiple staggered liquid slots; module base embedded with cooling core of stacked silicon (Si) micro-fluidic structure; backside micro-scale studs under Si micro-fluidic structure; semi-embedded watertight sealing pad with groove structures; indirect temperature relation sensing for driving activation and control; closed micro/macro loop with one pump for heat delivery and rejection; compact module with intact micro/macro liquid cooling and control system. Several simulations have been conducted to investigate and compare the performance of the new module. Comparisons are made between conventional and proposed solutions. Various embodiments may achieve aggressive cooling capability for future thermal management.

Figure 3A:
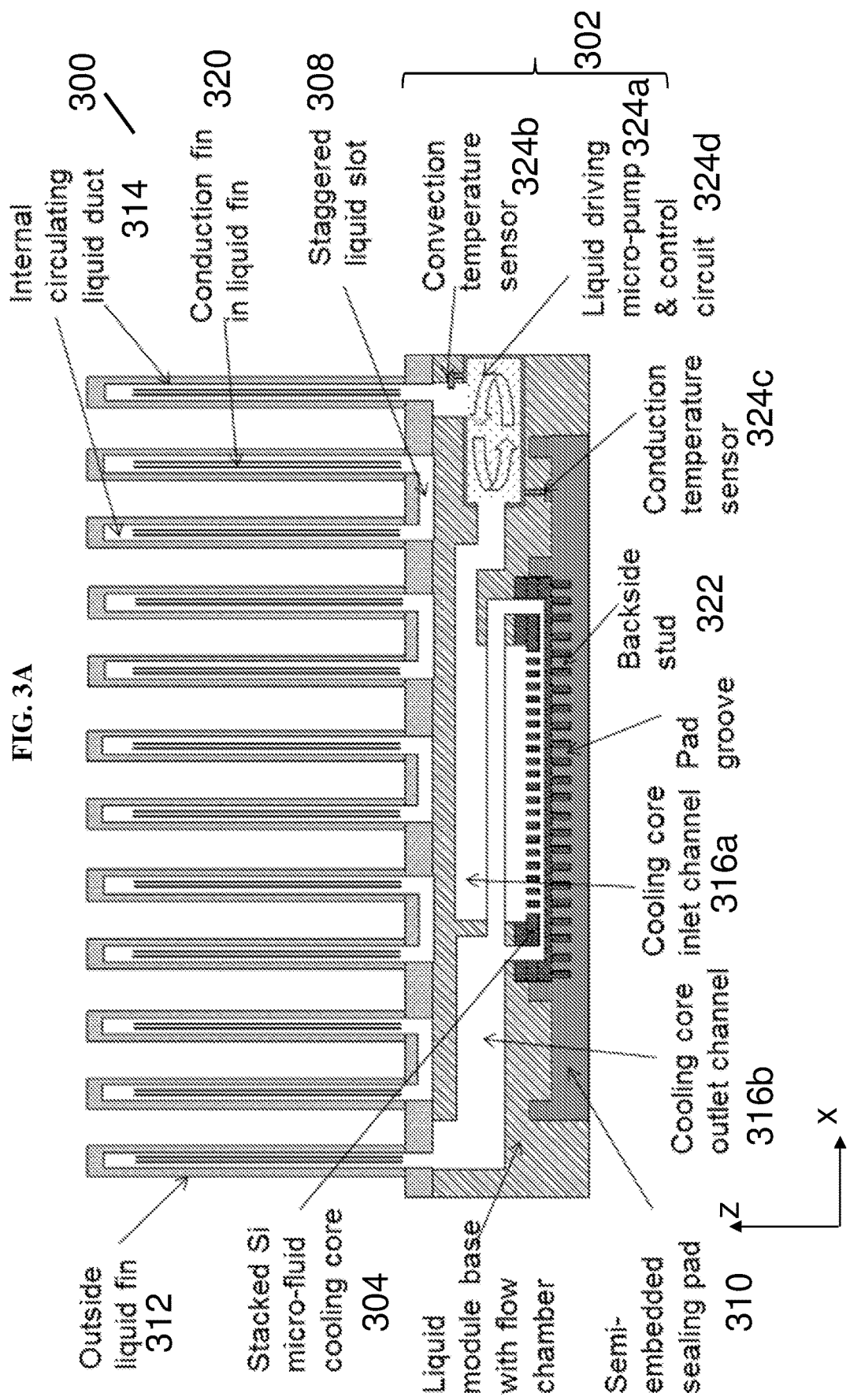
FIG. 3A is a schematic showing a cross-sectional side view of a liquid cooling module according to various embodiments.
Figure 3B:
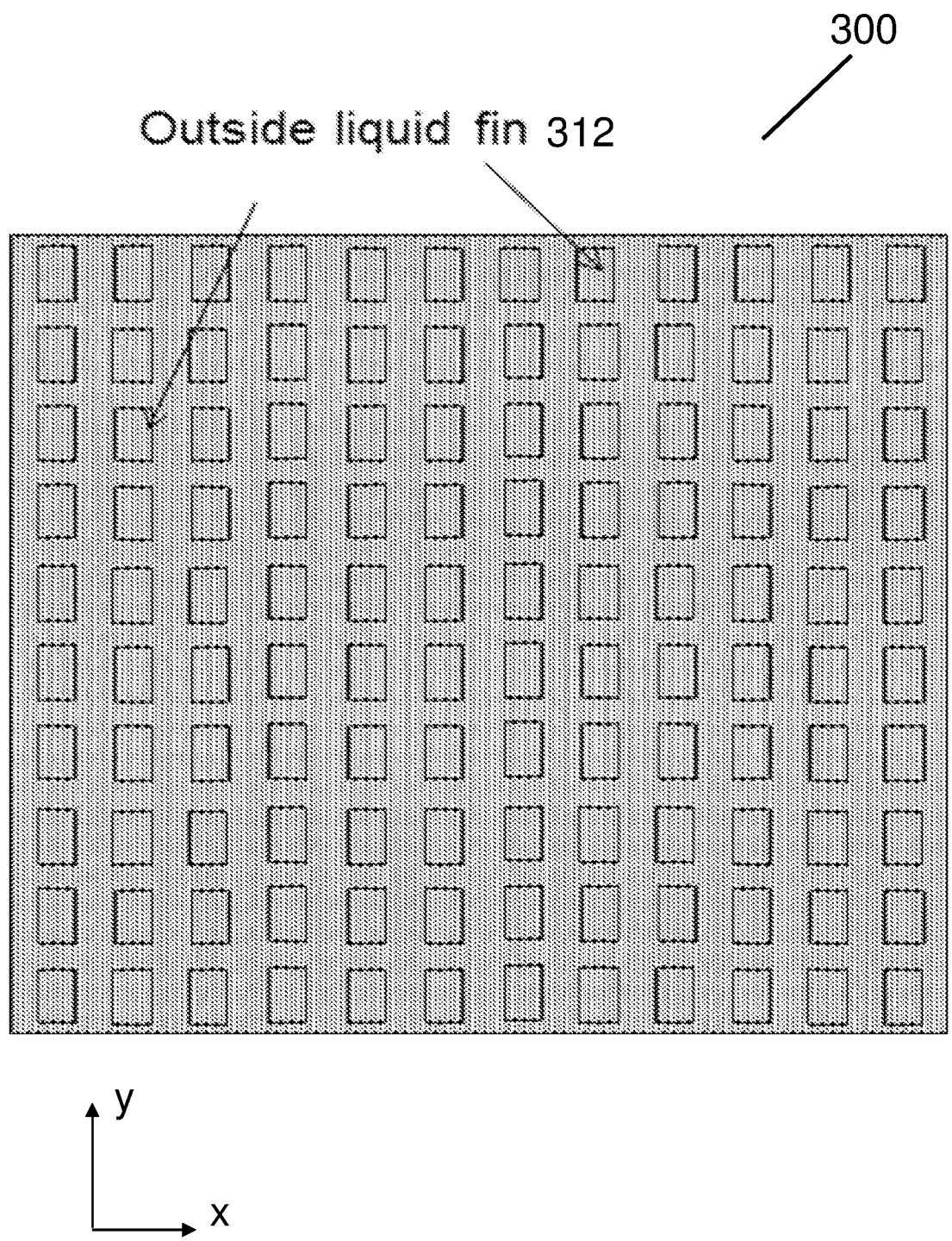
FIG. 3B is a schematic showing a top view of the liquid cooling module shown in FIG. 3A according to various embodiments.
Figure 3C:
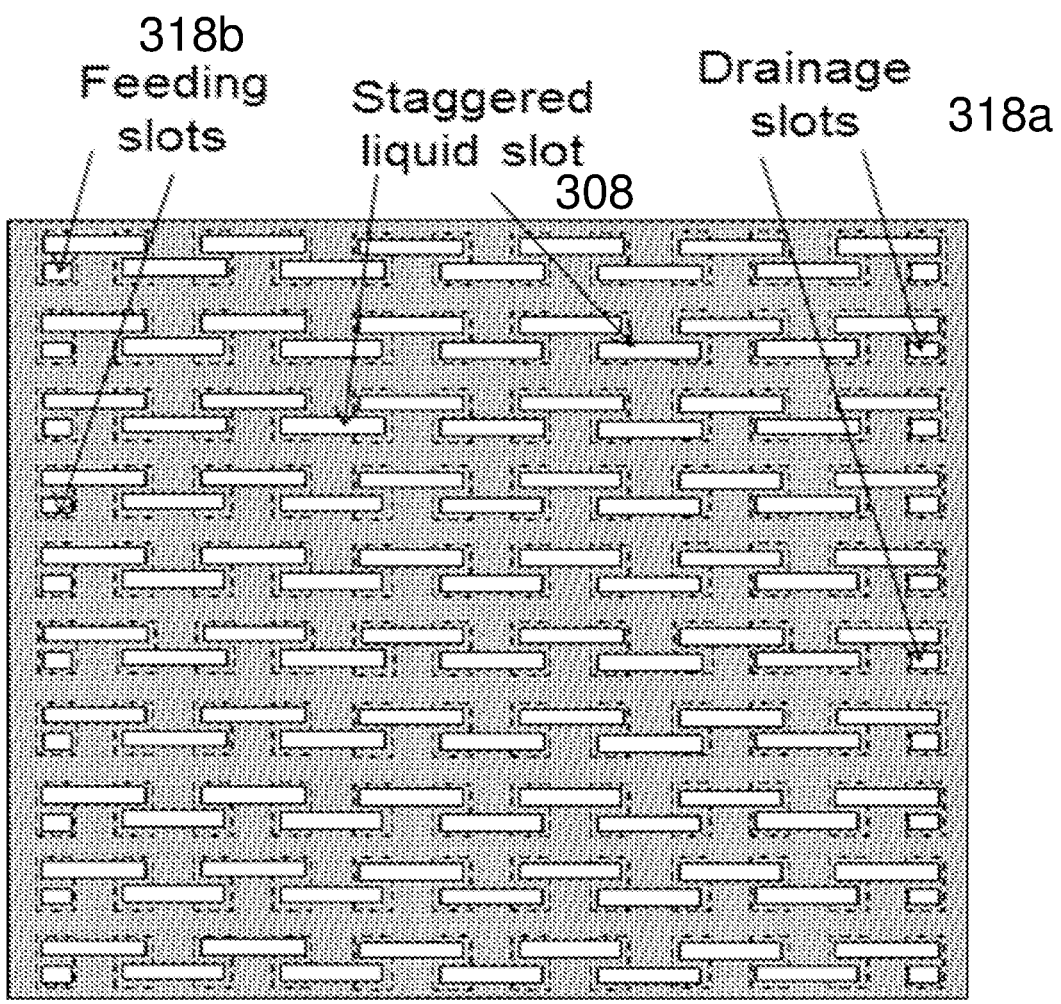
FIG. 3C is a schematic of a cross-sectional top view of the module according to various embodiments showing the array of liquid slots.

FIG. 3A is a schematic showing a cross-sectional side view of a liquid cooling module 300 according to various embodiments. FIG. 3B is a schematic showing a top view of the liquid cooling module 300 shown in FIG. 3A according to various embodiments. The cooling module 300 may include a main body 302 including a cooling core 304 including a microfluidic structure configured to carry a cooling liquid. The cooling module 300 may additionally include a plurality of slots 308. FIG. 3C is a schematic of a cross-sectional top view of the module 300 according to various embodiments showing the array of liquid slots 308.

The cooling module may also include a sealing pad 310 configured to transmit heat from an electronic device to the cooling core 304. The cooling module 300 may further include a plurality of fins 312 extending from the main body 302, each of the plurality of fins 312 including an internal circulating liquid duct such that the liquid cooling module includes a plurality of internal circulating liquid ducts 314 in fluidic communication with the microfluidic structure.

The main body 302 may also include the cooling core inlet channel 316a configured to carry the cooling liquid from the plurality of internal circulating liquid ducts 314 to the microfluidic structure included in the cooling core 304, as well as the cooling core outlet channel 316b configured to carry the cooling liquid from the microfluidic structure included in the cooling core 304 to the plurality of internal circulating liquid ducts 314. The cooling liquid may be carried from the ducts 314 to the inlet channel 316a via drainage slots 318a as shown in FIG. 3C. The cooling liquid may be fed to the ducts 314 from the outlet channel 316b via feeding slots 318b as shown in FIG. 3C.

As indicated in FIGS. 3A-C, the first and second portions of the internal circulating liquid ducts 314 may extend parallel to the z axis, the intervening portions of the internal circulating liquid ducts 314 may extend parallel to the y axis, and the liquid slots 308 may extend parallel to the x axis.

Figure 3D:
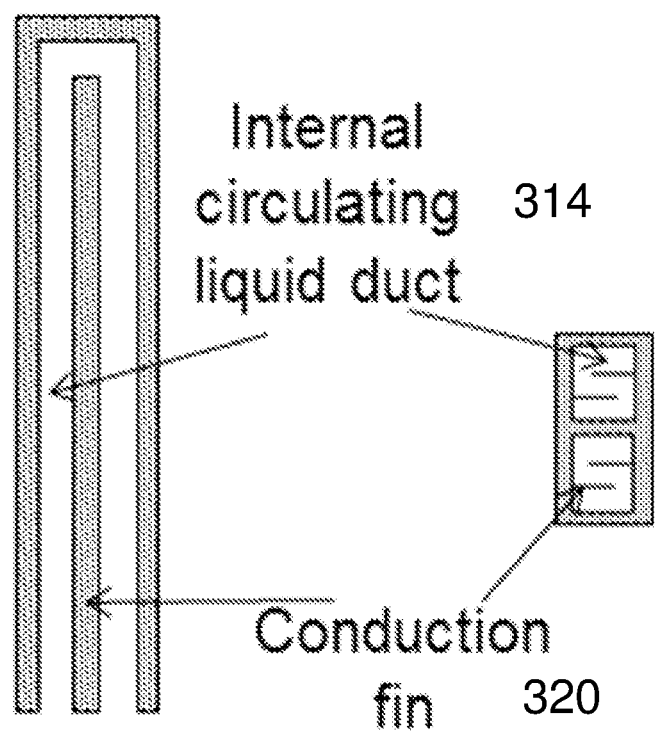
FIG. 3D is a schematic showing (left) the cross-sectional side view of a fin, and (right) cross-sectional top view of the fin of the module according to various embodiments.

FIG. 3D is a schematic showing (left) the cross-sectional side view of a fin 312, and (right) cross-sectional top view of the fin 312 of the module 300 according to various embodiments. The exterior raised fins 312 with internal circulating ducts 314 may be designed for heated liquid delivering and heat rejection to the outside environment. Each of the plurality of fins 312 may include a conduction fin 320 extending into the internal circulating liquid duct 314. The fin-in-fin structure may be designed for flow arrangement inside liquid fin and heat transfer enhancement for fast dissipation.

As shown in FIG. 3A, multiple liquid fins 312 may be designed to directly connect with multiple staggered liquid slots 308 to form smooth flow channel and provide uniform flow motion. The heat from the bottom electronic device may be first delivered by the cooling core 304 embedded in module base 302. The cooling core 304 may include stacked silicon (Si) microfluidic structures. This micro-fluidic core may 304 may be based on micro-channel flow and micro jet impingement for cooling. The backside micro-scale studs 322 under Si microfluidic structures may be designed for bottom heat conduction improvement.

The semi-embedded watertight sealing pad 310 with groove structures may be designed for cooling core integration, as well as to achieve reliable assembly and effective heat conduction.

In addition, a control and monitor mechanism involving indirect temperature relation sensing may be designed for liquid pump activation and control. The liquid cooling module 300 may further include a pump 324a configured to pump the cooling liquid so that the cooling liquid flows along the microfluidic structures and the plurality of internal circulating liquid ducts 314. The liquid cooling module 300 may additionally include one or more temperature sensors (e.g. convection temperature sensor 324b and conduction temperature sensor 324c) configured to sense temperature parameters of the liquid cooling module 300. The liquid cooling module 300 may also include a control circuit 324d configured to control the pump 324a based on the temperature parameters.

The two temperature sensors 324b, 324c may be located at different positions to monitor the conditions: the conduction sensor 324c may be designed to monitor the thermal condition through conduction from the sealing pad 310; the convection sensor 324b may be designed to monitor the thermal condition through liquid convection from the outlet of the liquid fins 312. The temperature relation between these two sensing points can provide an estimation for cooling requirements. The integrated micro-pump 324c may be controlled based on this estimation for different heating conditions.

As shown in FIG. 3A, a closed micro/macro loop with the micro-pump 324c may designed for internal heat delivery and outside heat rejection. The micro-pump 324c may be a mechanic gear pump, an electroosmotic pump, a piezoelectric actuator pump, or any other suitable pump. The compact module 300 with intact micro/macro liquid cooling and control system may achieve aggressive heat removal and maintain low energy cost and coolant volume.

The liquid ducts 314 may be connected in different manners. The plurality of fins 312 may be arranged in a plurality of rows.

Figure 3E:
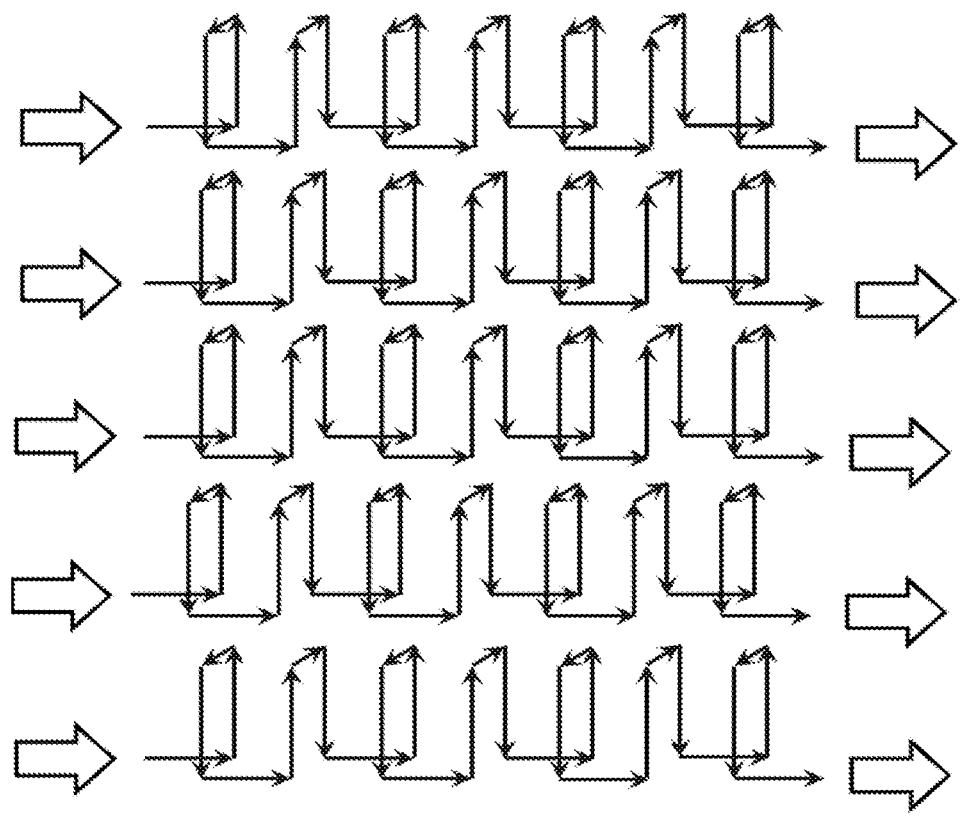
FIG. 3E is a schematic showing a side view of the flow of the cooling liquid along the internal circulating liquid ducts of the module according to various embodiments.
Figure 3E:
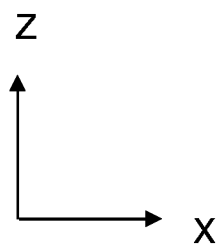
Figure 3F:
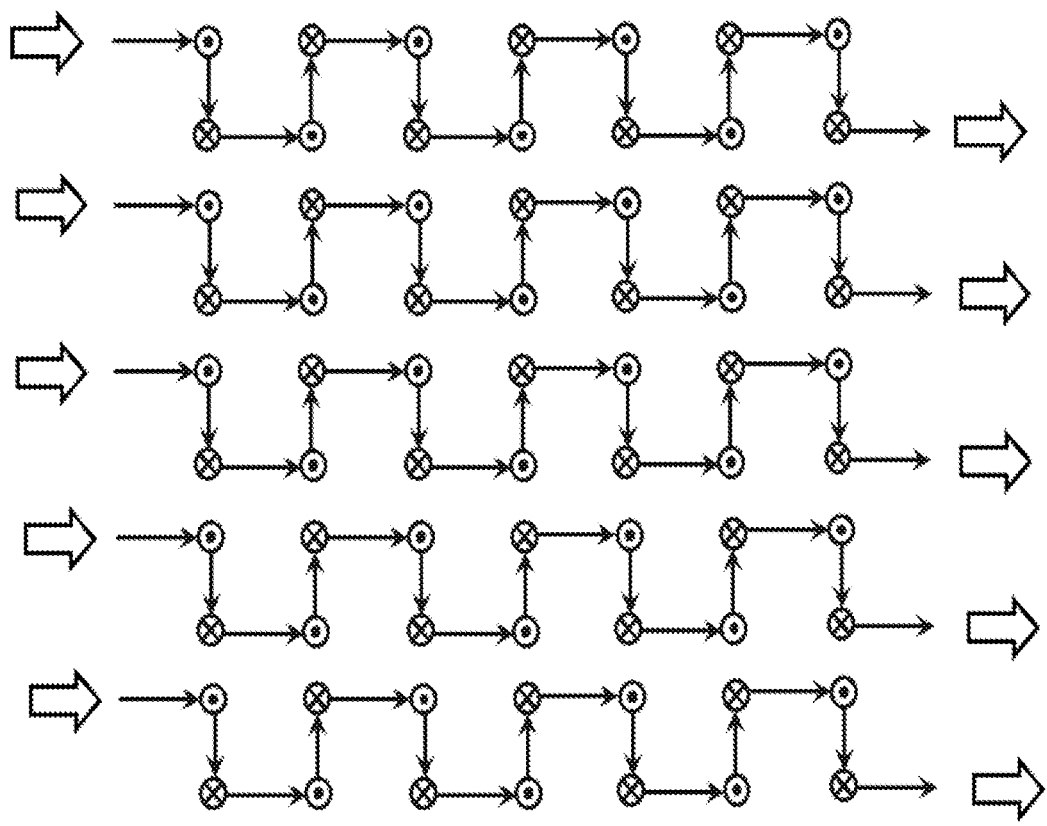
FIG. 3F is a schematic showing a top view of the flow of the cooling liquid along the internal circulating liquid ducts of the module as shown in FIG. 3E according to various embodiments.
Figure 3F:
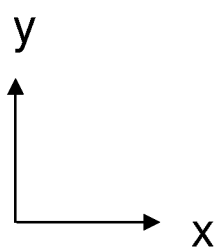

FIG. 3E is a schematic showing a side view of the flow of the cooling liquid along the internal circulating liquid ducts 314 of the module 300 according to various embodiments. FIG. 3F is a schematic showing a top view of the flow of the cooling liquid along the internal circulating liquid ducts 314 of the module 300 as shown in FIG. 3E according to various embodiments. As shown in FIGS. 3E-F, the plurality of fins 312 may be configured such that the liquid coolant flows in (multiple) parallel paths, each path formed by internal circulating ducts 314 included in a row of fins 312. In other words, the plurality of fins 312 may be such that the internal circulating ducts form multiple parallel paths. The liquid may flow along the multiple parallel paths. The ducts 314 may provide helix waving paths for enhanced flow motion of the cooling liquid, leading to effective energy transfer for heat dissipation to the outside environment.

Figure 3G:
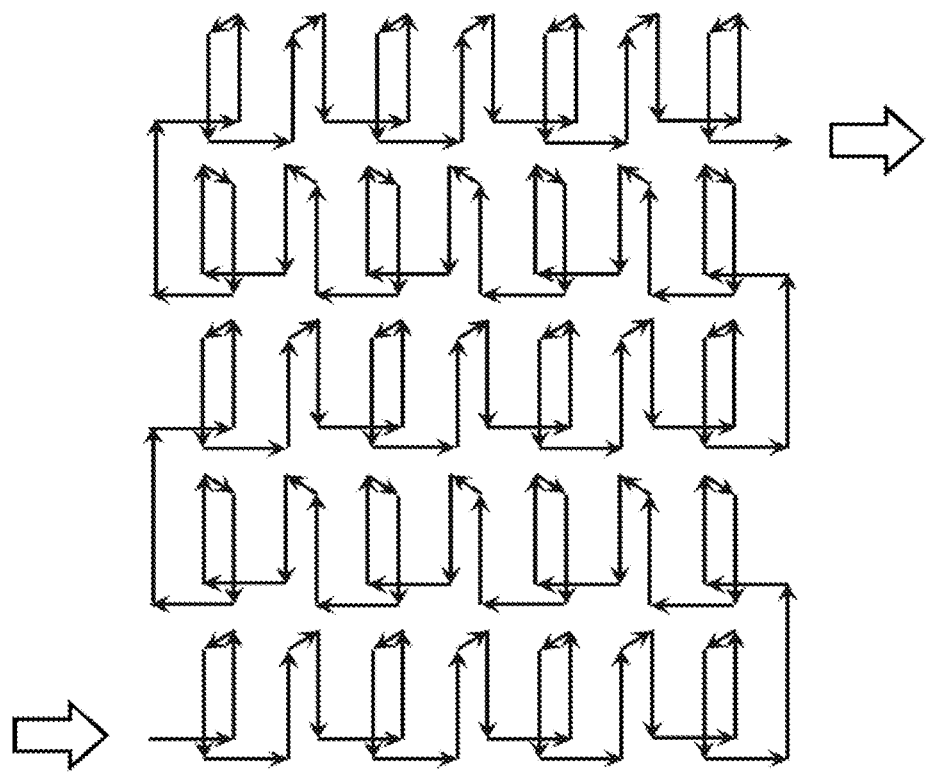
FIG. 3G is a schematic showing a side view of the flow of the cooling liquid along the internal circulating liquid ducts of the module according to various other embodiments.
Figure 3G:
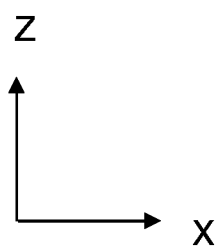
Figure 3H:
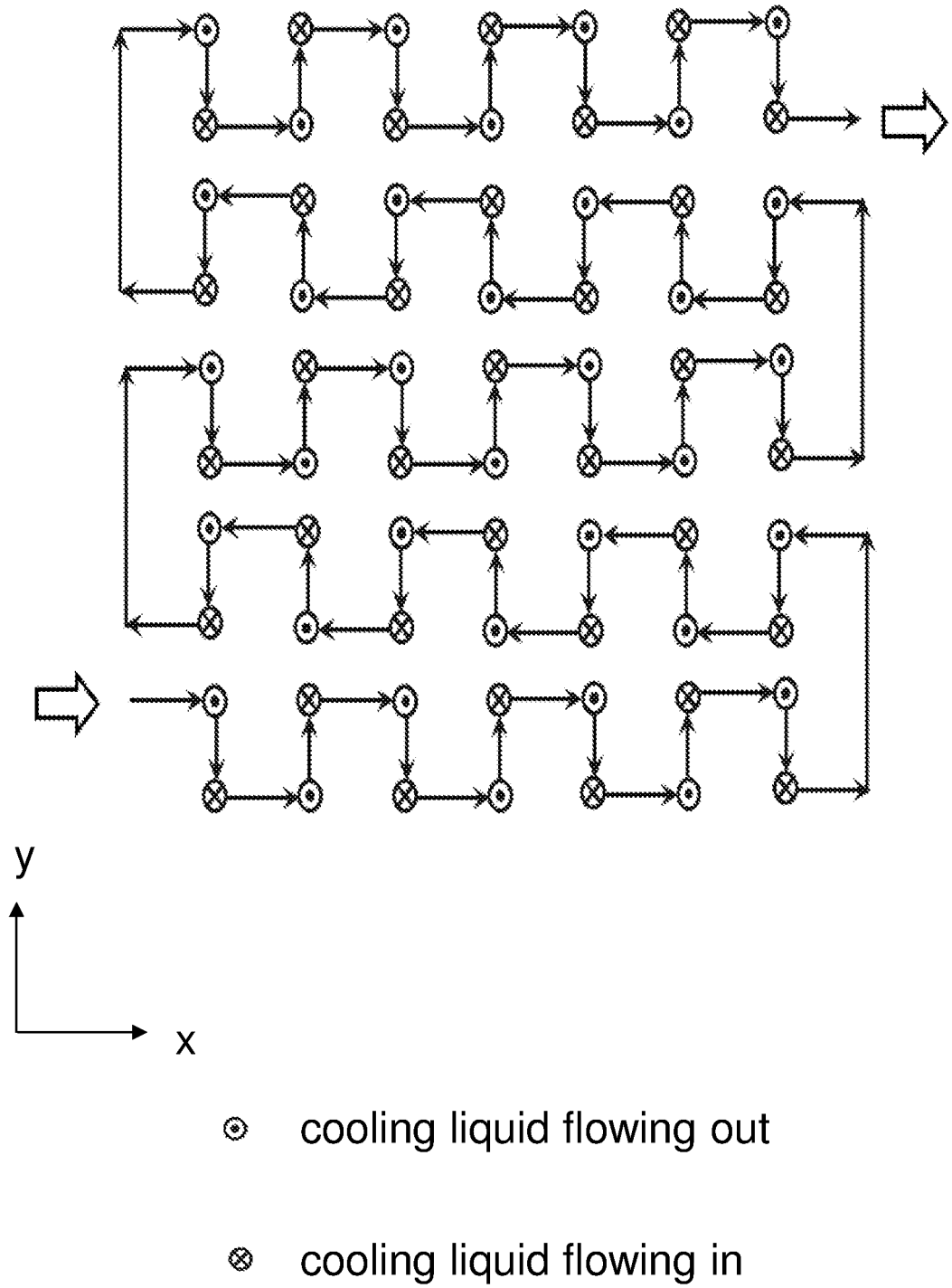
FIG. 3H is a schematic showing a top view of the flow of the cooling liquid along the internal circulating liquid ducts of the module as shown in FIG. 3G according to various other embodiments.

FIG. 3G is a schematic showing a side view of the flow of the cooling liquid along the internal circulating liquid ducts 314 of the module 300 according to various other embodiments. FIG. 3H is a schematic showing a top view of the flow of the cooling liquid along the internal circulating liquid ducts 314 of the module 300 as shown in FIG. 3G according to various other embodiments. As shown in FIGS. 3G-H, the plurality of fins 312 may be configured such that the liquid cooling flows from a first path formed by internal circulating ducts 314 included in a first row of fins to a second path formed by internal circulating ducts 314 included in a second row of fins. All the internal liquid circulating ducts 314 and slots 308 may be connected in series, which can further improve the thermal and hydraulic performance. The cooling capability of the compact solution may be highly enhanced.

Several simulations have been performed to investigate the hydraulic performance of the liquid cooling module 300 shown in FIGS. 3A-D.

The cooling liquid may flow from one side the structure of module to the other side through ducts 314 within liquid fins 312 and staggered liquid slots 308. Heated liquid from the core cooler 304 embedded can be cooled down when passing the liquid fins 312, and the heat may dissipate to the outside environment by convection with air of low temperature. The flow may deliver the heat flow over the liquid fins 312, which possess large areas for convection cooling, thus resulting to more uniform and effective heat rejection.

Figure 4B:
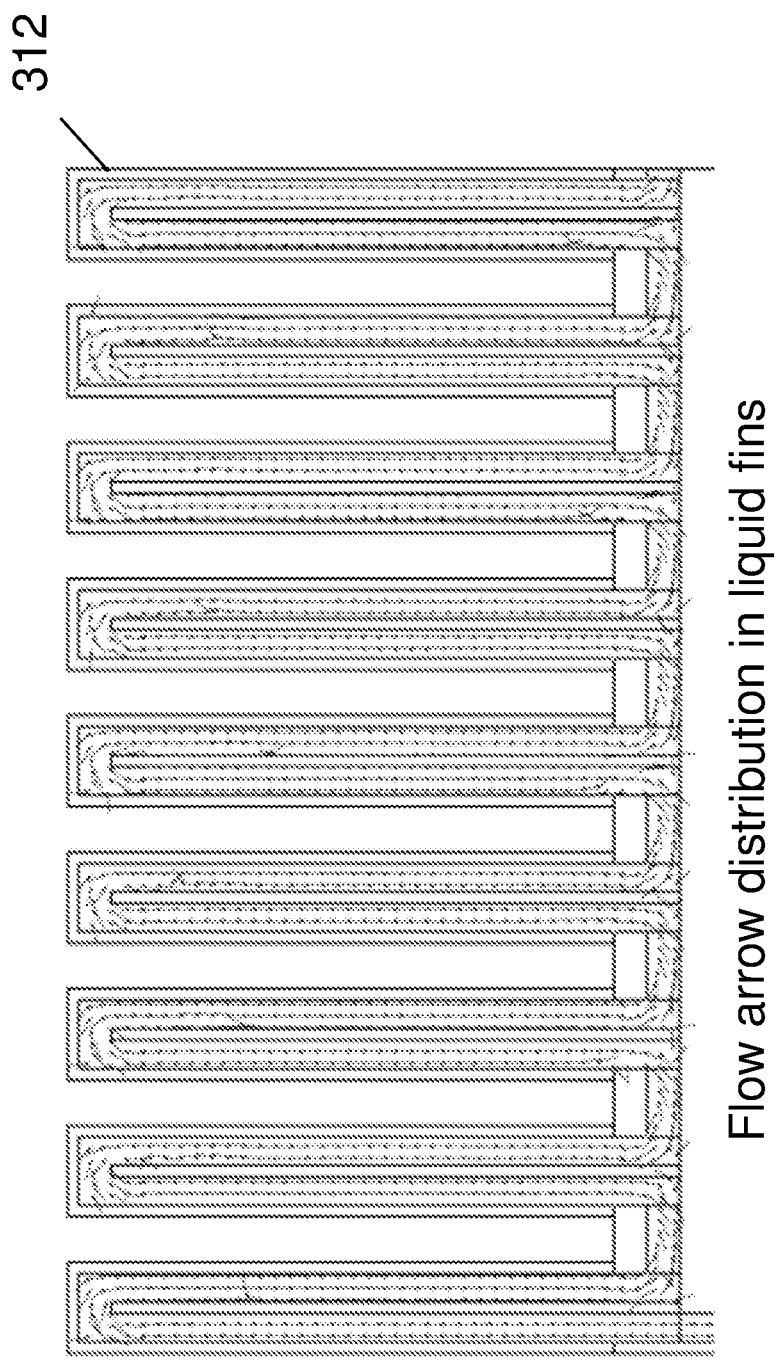
FIG. 4B is a simulation diagram showing the flow arrow distribution in fins of the module according to various embodiments.

FIG. 4A is a simulation diagram showing the pressure distribution in fins 312 of the module 300 according to various embodiments. FIG. 4B is a simulation diagram showing the flow arrow distribution in fins 312 of the module 300 according to various embodiments.

Figure 4C:
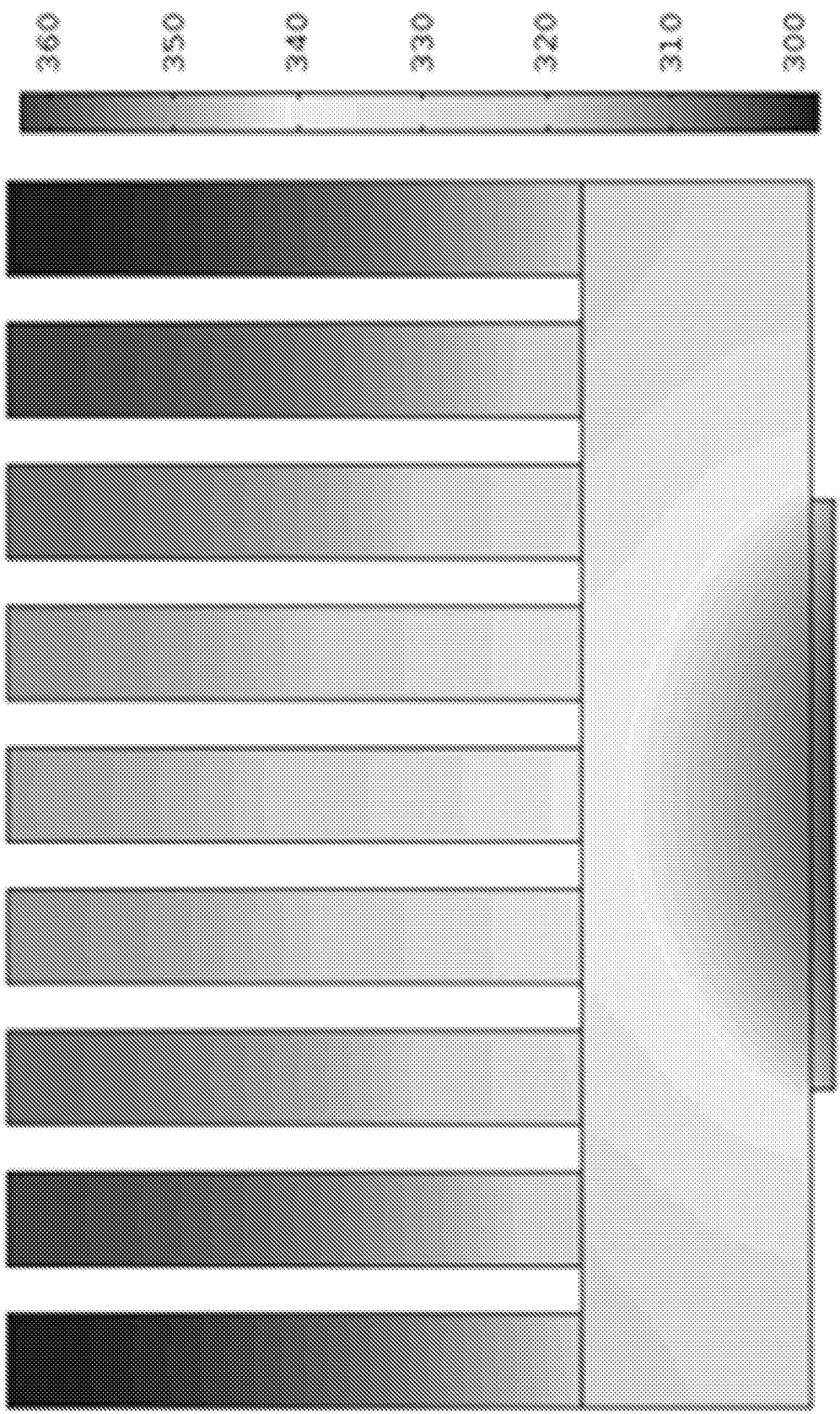
FIG. 4C is a simulation diagram showing the temperature distribution of a normal heat sink (HS).
Figure 4D:
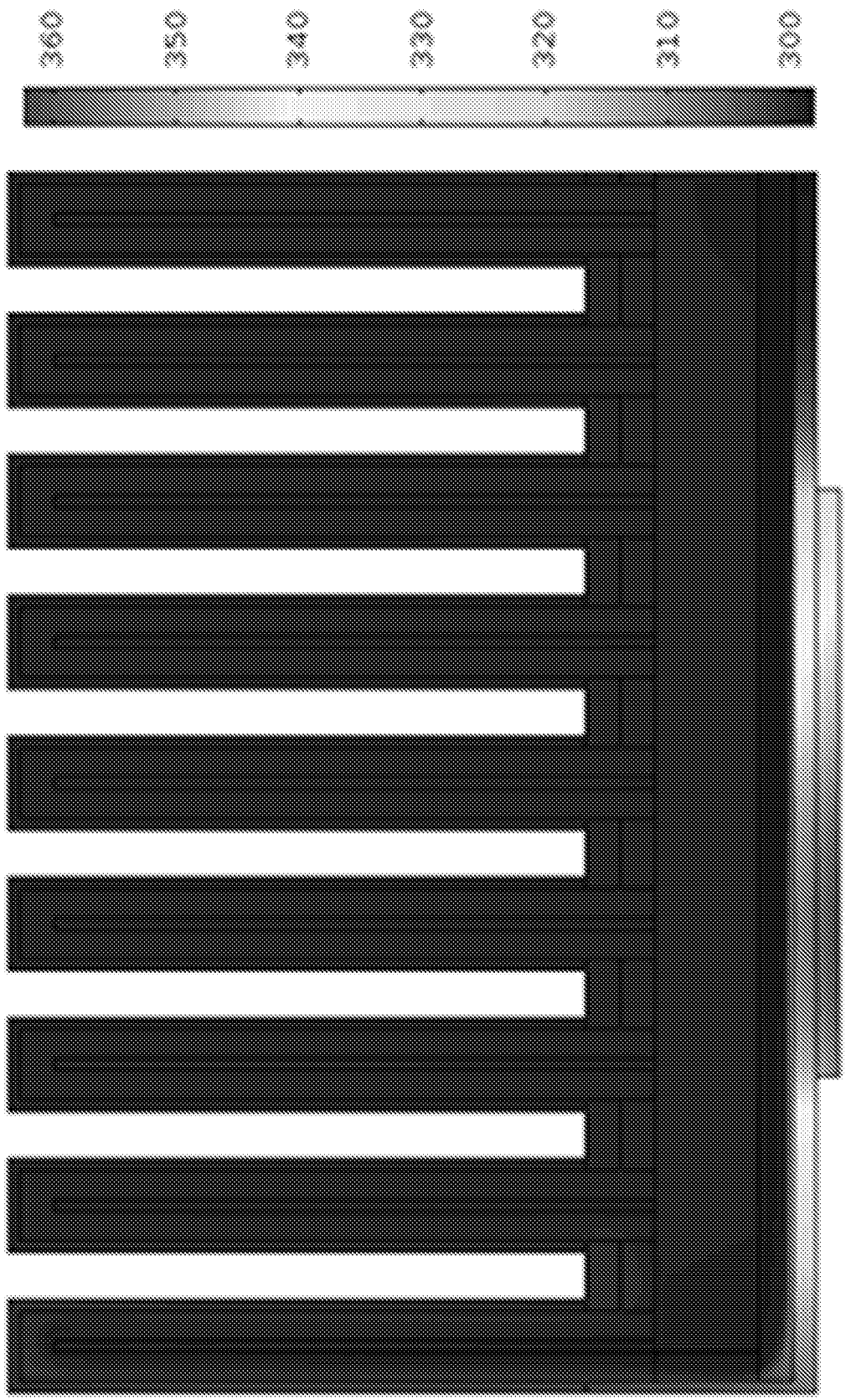
FIG. 4D is a simulation diagram showing the temperature distribution of the module according to various embodiments.

FIG. 4C is a simulation diagram showing the temperature distribution of a normal heat sink (HS). FIG. 4D is a simulation diagram showing the temperature distribution of the module 300 according to various embodiments. The performance comparison may be based on a normal cooling solution used in the cooling module 300. FIGS. 4C-D show that the cooling module 300 may improve temperature distribution compared to a conventional heatsink.

Figure 4E:
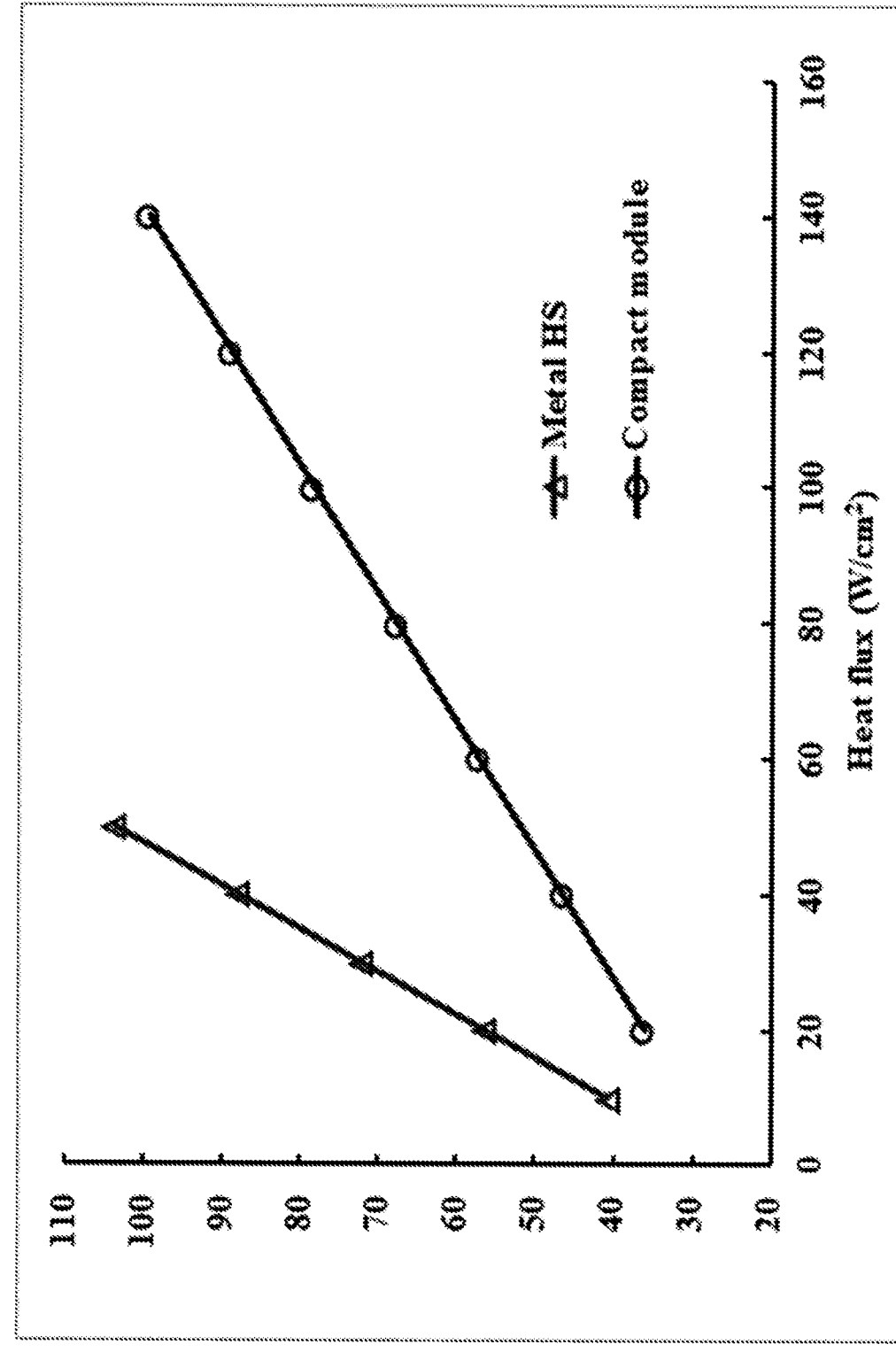
FIG. 4E is a plot of maximum chip temperature (in degrees Celsius or ° C.) as a function of heat flux (in watts per centimeter square or $W/cm^2$) comparing the heat dissipation capabilities of a conventional metal heat sink (HS) and the module ("compact module") according to various embodiments.

FIG. 4E is a plot of maximum chip temperature (in degrees Celsius or °C.) as a function of heat flux (in watts per centimeter square or W/cm$^2$) comparing the heat dissipation capabilities of a conventional metal heat sink (HS) and the module 300 ("compact module") according to various embodiments.

The moving cooling liquid in the module 300 may deliver the heat from the bottom heat source to the top pin fin array for rejection more effectively as compared to a conventional heat sink, enhancing the heat convection to outside environment. For the same bottom chip (i.e. same heating power), the maximum chip temperature achieved with the module 300 may be reduced by more than 50%, as compared with the conventional metal heat sink.

At the same operation temperature limit, the liquid cooling module 300 may dissipate more than 3 times heating power as compared to a conventional metal heat sink. The temperature distribution in the liquid cooling module 300 (having heated liquid circulating within) may be more uniform compared with the conventional metal heat sink. Low pumping energy and low coolant volume may be required to achieve extremely high heat dissipation capability.

Various embodiments may relate to a compact liquid cooling module for thermal management of electronic devices. The module may include the following features: external raised liquid fins with internal circulating ducts and fin-in-fin structures; multiple liquid fins directly connected with multiple staggered liquid slots; module base embedded with cooling core of stacked silicon (Si) microfluidic structure; backside micro-scale studs under Si microfluidic structure; semi-embedded watertight sealing pad with groove structures; indirect temperature relation sensing for driving activation and control; closed micro/macro loop with one pump for heat delivery and rejection; and/or compact module with intact micro/macro liquid cooling and control system. The heat dissipation capability can be highly improved, with easy implementation. Various embodiments may be an attractive candidate for future device thermal management.

Various embodiments may relate to a compact liquid cooling system with effective heat dissipation capability, enhanced reliability for long term application, as well as controllable pumping (leading to high energy savings). Various embodiments may be potentially usable in high performance processor thermal management and in power modules.

Various embodiments may relate to a liquid cooling system with improved convection and conduction. Various embodiments may include micro/macro fluidic structure integration and cooling enhancement. Various embodiments may possess high cooling capabilities, may be easy to fabricate, and/or may have high reliability. Various embodiments may be applicable to cool different device sizes which act as heat sources. Various embodiments may be energy efficient and/or may have low coolant volume requirements While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A liquid cooling module comprising:
a main body comprising:
a cooling core comprising a microfluidic structure configured to carry a cooling liquid; and
a plurality of slots;
a sealing pad configured to transmit heat from an electronic device to the cooling core; and
a plurality of fins extending from the main body, each of the plurality of fins comprising an internal circulating liquid duct such that the liquid cooling module comprises a plurality of internal circulating liquid ducts in fluidic communication with the microfluidic structure;
wherein a first fin of the plurality of fins comprises a first internal circulating liquid duct comprising:
a first portion connected to a first slot of the plurality of slots and configured to lead the cooling liquid away from the cooling core;
a second portion connected to a second slot of the plurality of slots and configured to lead the cooling liquid towards the cooling core; and
an intervening portion connecting the first portion and the second portion of the first fin;
wherein a second fin of the plurality of fins includes a second internal circulating liquid duct configured to receive the cooling liquid from the first internal circulating liquid duct via the second slot of the plurality of slots, the second internal circulating liquid duct comprising:
a first portion connected to the second slot of the plurality of slots and configured to lead the cooling liquid away from the cooling core;
a second portion connected to a third slot of the plurality of slots and configured to lead the cooling liquid towards the cooling core; and
an intervening portion connecting the first portion and the second portion of the second fin;
wherein the first internal circulating liquid duct is configured so that the flow of the cooling liquid along the first internal circulating liquid duct is in a first rotation direction; and
wherein the second internal circulating liquid duct is configured so that the flow of the cooling liquid along the second internal circulating liquid duct is in a second rotation direction opposite the first rotation direction.

2. The liquid cooling module according to claim 1, further comprising:
a pump configured to pump the cooling liquid so that the cooling liquid flows along the microfluidic structure and the plurality of internal circulating liquid ducts.

3. The liquid cooling module according to claim 2, wherein the pump is any one selected from group consisting of a mechanical gear pump, an electroosmotic pump, and a piezoelectric actuator pump.

4. The liquid cooling module according to any claim 2, further comprising:
one or more temperature sensors configured to sense temperature parameters of the liquid cooling module; and
a control circuit configured to control the pump based on the temperature parameters.

5. The liquid cooling module according to claim 4, wherein the one or more temperature sensors comprise a conductor temperature sensor configured to sense a temperature parameter of a region between the sealing pad and the microfluidic structure; and
wherein the one or more temperature sensors comprise a convection temperature sensor configured to sense a temperature parameter related to the cooling liquid.

6. The liquid cooling module according to claim 1, wherein the main body further comprises a plurality of backside studs configured to transmit heat from the sealing pad to the cooling core.

7. The liquid cooling module according to claim 1, wherein the microfluidic structure comprises an array including a plurality of micro-jet channels configured to cool the cooling liquid via micro-jet impingement.

8. The liquid cooling module according to claim 7,
wherein the microfluidic structure comprises an inlet channel configured to direct the cooling liquid to the array; and
wherein the microfluidic structure comprises an outlet channel configured to direct the cooling liquid away from the array.

9. The liquid cooling module according to claim 1, wherein each of the plurality of fins comprises a conduction fin extending into the internal circulating liquid duct.

10. The liquid cooling module according to claim 1, wherein the plurality of fins is arranged in a plurality of rows.

11. The liquid cooling module according to claim 10, wherein the plurality of fins is configured such that a liquid coolant flows in parallel paths, each path formed by internal circulating ducts included in a row of fins.

12. The liquid cooling module according to claim 10, where the plurality of fins is configured such that the cooling liquid flows from a first path formed by internal circulating ducts included in a first row of fins to a second path formed by internal circulating ducts included in a second row of fins.

13. The liquid cooling module according to claim 1, wherein the plurality of slots is aligned in parallel in a staggered manner.

14. The liquid cooling module according to claim 1, wherein the intervening portion of the first internal circulating liquid duct extends parallel to a first axis, the first axis perpendicular to a second axis in which each of the first portion and the second portion of the first internal circulating liquid duct extends parallel to; and
wherein the intervening portion of the second internal circulating liquid duct extends parallel to the first axis perpendicular to the second axis in which each of the first portion and the second portion of the second internal circulating liquid duct extends parallel to.

15. The liquid cooling module according to claim 14, wherein each of the first slot, the second slot, and the third slot extends parallel to a third axis which is perpendicular to the second axis.

16. The liquid cooling module according to claim 1,
wherein the first rotation direction is anticlockwise; and
wherein the second rotation direction is clockwise.

17. A method of forming a liquid cooling module, the method comprising:
forming a main body comprising:
a cooling core including a microfluidic structure configured to carry a cooling liquid; and
a plurality of slots;
forming a sealing pad configured to transmit heat from an electronic device to the cooling core; and
forming a plurality of fins extending from the main body, each of the plurality of fins comprising an internal circulating liquid duct such that the liquid cooling module comprises a plurality of internal circulating liquid ducts in fluidic communication with the microfluidic structure;

wherein a first fin of the plurality of fins comprises a first internal circulating liquid duct comprising:
  a first portion connected to a first slot of the plurality of slots and configured to lead the cooling liquid away from the cooling core;
  a second portion connected to a second slot of the plurality of slots and configured to lead the cooling liquid towards the cooling core; and
  an intervening portion connecting the first portion and the second portion of the first fin;

wherein a second fin of the plurality of fins comprises a second internal circulating liquid duct configured to receive the cooling liquid from the first internal circulating liquid duct via the second slot of the plurality of slots, the second internal circulating liquid duct comprising:
  a first portion connected to the second slot of the plurality of slots and configured to lead the cooling liquid away from the cooling core;
  a second portion connected to a third slot of the plurality of slots and configured to lead the cooling liquid towards the cooling core; and
  an intervening portion connecting the first portion and the second portion of the second fin;

wherein the first internal circulating liquid duct is configured so that the flow of the cooling liquid along the first internal circulating liquid duct is in a first rotation direction; and wherein the second internal circulating liquid duct is configured so that the flow of the cooling liquid along the second internal circulating liquid duct is in a second rotation direction opposite the first rotation direction.

18. The method according to claim 17, further comprising:
  forming a pump configured to pump the cooling liquid so that the cooling liquid flows along the microfluidic structures and the plurality of internal circulating liquid ducts.

19. The method according to claim 17, further comprising:
  forming one or more temperature sensors configured to sense temperature parameters of the cooling module; and
  forming a control circuit configured to control the pump based on the temperature parameters.

\* \* \* \* \*